United States Patent [19]

Anceau et al.

[11] Patent Number: 5,236,873
[45] Date of Patent: Aug. 17, 1993

[54] METHOD FOR CONTACTING A SEMICONDUCTOR COMPONENT

[75] Inventors: Christine Anceau, Saint Roch; Jean-Baptiste Quoirin, Tours, both of France

[73] Assignee: SGA-Thomson Microelectronics, S.A., Gentilly, France

[21] Appl. No.: 884,336

[22] Filed: May 18, 1992

[30] Foreign Application Priority Data

May 17, 1991 [FR] France ................ 91 06347

[51] Int. Cl.$^5$ ............... H01L 21/283; H01L 21/306
[52] U.S. Cl. .................... 437/230; 437/193; 437/228; 437/904; 427/98
[58] Field of Search ........... 437/230, 904, 246, 162, 437/193, 228; 427/98; 205/210, 170, 181; 156/627, 653

[56] References Cited

U.S. PATENT DOCUMENTS

| | | | |
|---|---|---|---|
| 4,122,215 | 10/1978 | Vratny | 427/230 |
| 4,162,337 | 7/1979 | D'ASaro et al. | 437/230 |
| 4,297,393 | 10/1981 | Denning et al. | 427/230 |
| 4,321,283 | 3/1982 | Patel et al. | 437/230 |
| 4,609,565 | 9/1986 | Yates | 437/230 |
| 4,612,698 | 9/1986 | Gonsiorawski et al. | 437/230 |
| 4,655,884 | 4/1987 | Hills et al. | 205/181 |

FOREIGN PATENT DOCUMENTS

| | | | |
|---|---|---|---|
| 2500855 | 9/1982 | France | 437/904 |
| 66374 | 6/1977 | Japan | 437/230 |
| 61-202429 | 9/1985 | Japan | |
| 2208964 | 4/1989 | United Kingdom | 437/904 |

Primary Examiner—T. N. Quach
Attorney, Agent, or Firm—Lowe, Price, LeBlanc & Becker

[57] ABSTRACT

A metallization layer forming a bonding pad is formed on a diffused region of a semiconductor substrate for making electrical connection to the diffused region. A polysilicon layer of the same conductivity type as the diffused region is formed on the diffused region, overlapping onto sidewalls and peripheral portions of a silicon oxide mask. A two-layer metallization layer comprising a first nickel layer and an overlying gold layer covers the polysilicon layer. The semiconductor device is formed by diffusing an impurity into the upper surface of a semiconductor substrate using a silicon oxide mask. A doped polysilicon layer is formed on the diffused region, overlapping onto sidewall portions and extending up onto the silicon oxide mask layer. The substrate is immersed in a metal-plating electroless bath to form layers of nickel and gold on conductive portions of the substrate including on the polysilicon and on a face of the substrate opposite the polysilicon layer. The substrate is selectively etched to remove contaminants from the silicon oxide mask introduced during immersion in the electroless bath. The device is then annealed at a suitable temperature. With a plurality of devices formed on a single wafer, the wafer is scored and diced to separate the devices for individual packaging.

9 Claims, 1 Drawing Sheet

METHOD FOR CONTACTING A SEMICONDUCTOR COMPONENT

TECHNICAL FIELD

The present invention generally relates to discrete semiconductor devices, and more particularly, to a method for forming a bonding pad on a semiconductor substrate.

BACKGROUND ART

Conventionally, a large number of identical semiconductor devices are formed on a common silicon wafer by selectively subjecting the wafer to a sequence of processing steps. The wafer is then scored and diced to separate the individual semiconductor devices called chips. Solder preforms are used to bond connection leads to opposite major surfaces of a chip to form a semiconductor device such as a diode.

FIG. 1 is a partial cross section of a typical planar diode semiconductor device formed on a semiconductor substrate. The diode comprises a layered substrate including $N^+$-type lower layer 1 and N-type upper layer 2 formed immediately thereon. The diode is a planar type device comprising stacked layers of semiconductor material. P-type region 3 is formed by diffusing P-type impurities into N-type upper layer 2 through an aperture in silicon oxide layer 4 formed on upper layer 2.

An upper metallization layer 5 is formed on an upper surface of P-type region 3 and a lower metallization layer 6 is formed on an exposed lower surface of lower layer 1. Lower metallization extends across the entire lower surface of the substrate. However, upper metallization layer 5 must be patterned so as not to extend beyond the borders of each diode. This is because metal formed in the vicinity of dicing lines defining the individual devices can produce residual metal particles during dicing operations. The residual metal particles can cause lateral shorting between metallization layer 5 and underlying upper layer 2 thereby providing a low resistance path around the PN junction and rendering the diode inoperative. Extending metallization layer 5 to the edge of the chip results in lateral passivation problems normally encountered with mesa-type diodes.

Conventionally, upper and lower metallization layers 5 and 6 are formed by depositing successive metals on the surfaces of a substrate by successive evaporation or sputtering steps. Typically, an aluminum layer is formed directly on the substrate with successive layers of nickel and gold formed thereon. The nickel layer is essential to permit attachment of a conductor by welding. The underlying aluminum layer is used to prevent migration of the overlying nickel into the substrate and because the aluminum provides a low resistance electrical contact with the substrate. The uppermost gold layer prevents oxidation of the nickel layer prior to the welding phase.

After the entire upper and lower surfaces of the substrate are covered by the aluminum/nickel/gold layers, the upper layer is patterned by photoetching to form separate metallization layers 5 constituting individual bonding pads. Device leads are attached to the bonding pads using solder preforms.

A disadvantage of the conventional photoetching technique of forming the bonding pads is that a substantial portion of the upper metallization layer, typically ranging from 40 to 50%, must be removed by etching. As described, this layer comprises a relatively expensive noble metal such as gold which is not easily recoverable from an etching solution and is therefore wasted.

To avoid the above-mentioned metal wasting, a method is disclosed in the Patent Abstract of Japan, Vol. 11, No. 33, JP 61-202429, of forming a metal contact on a surface of a semiconductor chip comprising a diffused region delimited by an isolating layer forming a mask. The method comprises the steps of forming a polysilicon layer doped to be the same conductivity type as the diffused region, patterning the polysilicon layer so that it covers the diffused region and overlaps the internal peripheral surfaces of said mask, and immersing the wafer in a metal plating bath so that metal is deposited on the conductive surfaces of the wafer.

It appears that the components produced according to this method have a relatively short lifetime and that their characteristics tend to vary over time.

SUMMARY OF THE INVENTION

An object of the invention is to avoid this drawback and to obtain components having a long lifetime.

Another object of the invention is to permit the deposition of a plurality of metal layers.

According to the invention, a bonding pad is formed on the surface of a semiconductor chip comprising a diffused region delineated by an isolated masking layer, the chip being part of a semiconductor wafer. A doped polysilicon layer is selectively formed on the diffused region, overlapping onto internal peripheral portions of the isolating masking layer. The polysilicon layer is the same conductivity type as that of the diffused region. The wafer is immersed in an electroless metal plating bath to deposit a metal on conductive surfaces of the wafer. Exposed portions of the isolating masking layer are partially etched immersing the wafer in an etching bath.

According to a feature of the invention, the electroless metal plating step includes immersion of the wafer in a nickel-plating electroless bath followed by immersion in a gold-plating electroless bath, a partial etching of the oxide layer being performed after each plating step.

According to another feature of the invention, the diffused region is formed by diffusion of impurities from the overlying doped polysilicon layer during heat treatment of the chip.

According to still another feature of the invention, the chip constitutes a diode or a double diode.

The foregoing and other objects, features, aspects and advantages of the invention will become more apparent from the following detailed description of the present invention when taken in conjunction with the accompanying drawings.

As conventional in integrated circuit representations, the various layers in regions shown in the FIGURES are not drawn to scale to facilitate legibility of the drawings.

BEST MODE FOR CARRYING OUT THE INVENTION

Figure 2:
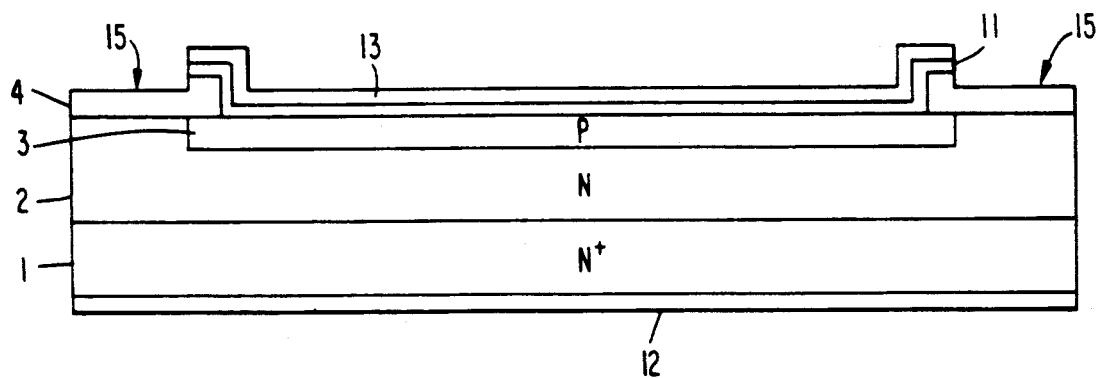
FIG. 2 is a cross-sectional view of a semiconductor device according to the invention.

Referring to FIG. 2, a semiconductor diode is formed in a substrate 1 comprising an N+-type lower layer 1 and N-type upper layer 2 formed thereon. A P-type diffusion region 3 is formed in an upper surface of upper layer 2 through an oxide mask 4 formed on the substrate. A composite metallization layer constituting a bonding pad comprises three layers formed in contact with diffusion region 3 and overlapping onto internal peripheral portions and an upper surface of oxide mask 4.

Figure 1:
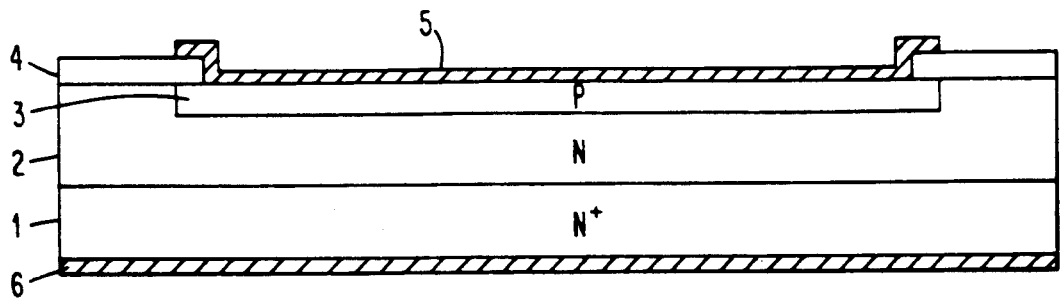
FIG. 1 is a partial cross-sectional view of a diode structure according to the prior art.

In a first step, a P-type polysilicon layer 11 is deposited over the entire surface of the substrate including the exposed upper surface of diffusion region 3 and oxide mask 4. The polysilicon layer 11 provides a low electrical resistance contact to diffusion region 3. Polysilicon layer 11 is then selectively etched using a mask to form a layer substantially corresponding to one of the metallization layers 5 of FIG. 1. In a second step, the wafer is immersed in a metal-plating electroless bath to form a lower metallization layer 12 on the bottom surface of the substrate and an upper metallization layer 13 on upper exposed portions of polysilicon layer 11. Because metal is deposited only on conductive regions of the chip, no metallization is formed on upper portions 15 of oxide mask 4.

Preferably, metallizations 12 and 13 are formed by successive depositions of nickel and gold. A nickel layer is deposited directly on polysilicon layer 11 by immersing the substrate in a nickel plating bath including a brine of nickel chloride and sodium hypophosphite.

After immersion in the nickel bath, a superficial etching to remove the exposed oxide layer is performed according to the invention. This operation permits to eliminate the upper part 15 of the oxide layer. Indeed, the applicant has noted that the usual rinsing steps are not sufficient and that contaminating ions, in particular alkaline ions such as sodium ions, are incrusted in the oxide layer during the plating step. In the absence of the etching step according to the invention, the alkaline ions incrusted during the immersion in the nickel bath migrate deep into the oxide layer during successive steps and introduce therein positive charges which make the characteristics of the underlying junction unstable and changeable over time. This penetration of alkaline ions is particularly important due to the fact that, after nickel plating, the wafer is annealed at high temperature, for example 600° C., to improve adhesion of nickel layers to each other and to the underlying polysilicon. Usually, to obtain a nickel layer having a desired thickness, a plurality of immersions in the nickel plating bath are performed, each plating step being followed by an etching step and an annealing step.

This etching away operation is preferentially carried out again after immersion in the gold bath. Annealing is not usually performed after these plating and etching steps because the gold layer is only an anti-oxidation layer.

Typically, the diode of FIG. 2 is formed on a square chip having sides ranging in length from 1 to 3 mm. For example, if the side of the chip is 1.6 mm, diffusion region 3 can be formed in the shape of a 1.3 by 1.3 mm square. Silicon oxide layer 4 typically has a thickness of approximately 2 $\mu$m with polysilicon layer 11 having a thickness of 250 nm and nickel/gold metallization layer having a thickness of approximately 600 nm.

Figure 3:
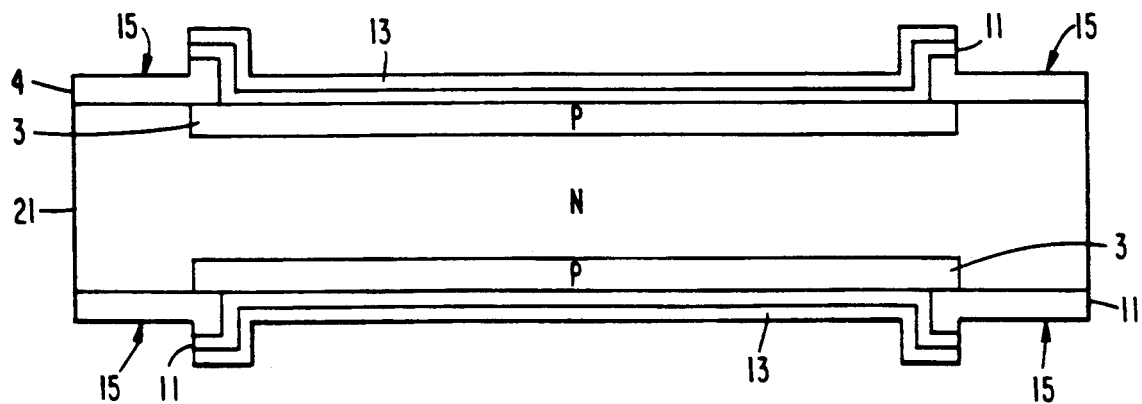
FIG. 3 is a cross-sectional view of semiconductor device according to another embodiment of the invention.

FIG. 3 illustrates another embodiment of the invention forming a double diode symmetric structure. The double diode is a PNP structure including serial reverse-biased diodes formed on opposite major surfaces of an N-type substrate 21. Opposing P-type diffusion regions 3 are formed on opposite surfaces of substrate 21 through an oxide mask 4 formed on opposite surfaces of the substrate. A composite metallization layer comprises polysilicon layers 11 and metallization layers 13 formed on respective P-type diffusion regions 3.

Finally, the method according to the invention avoids unnecessary deposition of gold which must be subsequently removed and wasted.

Although the present invention has been described and illustrated in detail, it is clearly understood that the same is by way of illustration and example only and is not to be taken by way of limitation, the spirit and scope of the present invention being limited only by the terms of the appended claims.

For example, although the invention has been described included a diode and method for forming the same, those skilled in the art will recognize that the claimed structure and method can be applied to a double diode symmetric structure wherein the step of depositing polysilicon is repeated on the upper and lower surfaces of the substrate. Similarly, the conductivity types described can be reversed. Further, although a metallization layer comprising nickel/gold has been described, other metals can be deposited by using appropriate electroless baths.

Finally, although P-type diffusion region 3 has been described as being formed prior to deposition of polysilicon layer 11, region 3 instead could be formed by annealing by using doping atoms contained in doped polysilicon layer 11. P-type impurities from polysilicon layer 11 diffuse into region 3 to form the diffused region when the substrate is thermally treated during subsequent steps. This method is preferred as the highly doped polysilicon layer has then, during the thermal treatment, a getter function for parasitic metal impurities unavoidably existing in the N type substrate 2.

What is claimed is:

1. A method of forming a metal contact on a surface of a semiconductor chip comprising a diffused region (3) delineated by an isolating layer forming a mask (4), said chip being part of a semiconductor wafer, comprising the steps of:
   (a) forming a polysilicon layer (11) doped according to the same conductivity type as the diffused region on said wafer and delineating said polysilicon layer so that it covers the diffused region and overlaps the internal peripheral surfaces of said mask;
   (b) immersing said wafer in a metal-plating electroless bath to deposit a metallization layer (12, 13) on conductive surfaces of said wafer including said polysilicon layer; and
   (c) after each metal-plating, immersing said wafer in a selective etching bath for partially etching away said mask.

2. The method according to claim 1, wherein step b) comprises immersing said semiconductor chip in a nickel-plating electroless bath followed by immersing in a gold-plating electroless bath.

3. The method according to claim 2, wherein each immersion in a nickel-plating bath, and when in an etching bath, is followed by an annealing step.

4. A method according to claim 1, further comprising a step of diffusing impurities from said doped polysilicon layer into said chip to form said diffused region.

5. The method according to claim 1, further comprising a step of forming a diode in said chip.

6. The method according to claim 1, further comprising a step of forming a double diode in said chip.

7. The method according to claim 1, wherein said step b) further includes depositing said metallization on a surface of said chip opposite said polysilicon layer.

8. The method according to claim 1, further comprising steps of dicing said wafer, separating said wafer into a plurality of said chips, and mounting said chips in respective chip carriers.

9. The method according to claim 8, further comprising a step of forming electrical connections between said metallization layers and leads of said chip carriers.

* * * * *

UNITED STATES PATENT AND TRADEMARK OFFICE
CERTIFICATE OF CORRECTION

PATENT NO. : 5,236,873
DATED : August 17, 1993
INVENTOR(S) : Christine ANCEAU et al.

It is certified that error appears in the above-identified patent and that said Letters Patent is hereby corrected as shown below:

On the title page, section [73], change the Assignee name from "SGA-Thomson" to --SGS-Thomson--.

Signed and Sealed this

Nineteenth Day of April, 1994

*Attest:*

BRUCE LEHMAN

*Attesting Officer*  Commissioner of Patents and Trademarks